United States Patent [19]

Fraas et al.

[11] Patent Number: 5,091,018
[45] Date of Patent: Feb. 25, 1992

[54] TANDEM PHOTOVOLTAIC SOLAR CELL WITH III-V DIFFUSED JUNCTION BOOSTER CELL

[75] Inventors: Lewis M. Fraas, Issaquah; James E. Avery, Fall City, both of Wash.; Gerald R. Girard, Oakland, Calif.

[73] Assignee: The Boeing Company, Seattle, Wash.

[21] Appl. No.: 523,710

[22] Filed: May 14, 1990

Related U.S. Application Data

[63] Continuation-in-part of Ser. No. 339,311, Apr. 17, 1989, abandoned.

[51] Int. Cl.$^5$ .................. H01L 31/052; H01L 31/05; H01L 31/0304; H01L 31/18
[52] U.S. Cl. ........................... 136/246; 136/249; 136/251; 136/244; 136/256; 136/262; 437/5; 357/30
[58] Field of Search ................. 136/244, 246, 249 TJ, 136/251, 256, 262; 357/30 B, 30 J, 30 Q; 437/5

[56] References Cited

U.S. PATENT DOCUMENTS

| | | | |
|---|---|---|---|
| 3,264,707 | 8/1966 | Elie | 437/167 |
| 4,227,941 | 10/1980 | Bozler et al. | 136/255 |
| 4,248,675 | 2/1981 | Bozler et al. | 204/38.3 |
| 4,309,225 | 1/1982 | Fan et al. | 437/2 |
| 4,547,622 | 10/1985 | Fan et al. | 136/249 TJ |
| 4,776,893 | 10/1988 | McLeod et al. | 136/249 TJ |
| 4,889,565 | 12/1989 | Fan et al. | 136/256 |

OTHER PUBLICATIONS

L. D. Partain et al., *J. Appl. Phys.*, vol. 62, No. 7, Oct. 1987, pp. 3010–3015.
W. Altenstadt et al., *Physica*, vol. 129B, pp. 497–500 (1985).
L. M. Fraas et al., *Solar Cells*, vol. 19, pp. 73–83 (1986-87).
L. M. Fraas et al., *J. Appl. Phys.*, vol. 61, No. 8, Apr. 1987, pp. 2861–2865.
L. M. Fraas, Chapter 4 in "Current Topics in Photovoltaics", Academic Press (1985).
L. M. Fraas et al., *J. Appl. Phys.*, vol. 66, Oct. 15, 1989, pp. 3866–3870.
L. Fraas et al., 1989 DOE/Sandia Crystalline Photovoltaic Technology Review Meeting, Sand 89-1543, pp. 173–177.
J. E. Avery et al., Space Photovoltaic Research & Technology (SPRAT), 1989.
L. M. Fraas et al., 24th Intersociety Energy Conversion Engineering Conference (IECEC-89), vol. 2, pp. 815–820 (Aug. 1989).
L. M. Fraas et al., *IEEE AES Magzine*, Nov. 1989, pp. 3–9.

*Primary Examiner*—Aaron Weisstuch
*Attorney, Agent, or Firm*—Donald J. Lisa

[57] ABSTRACT

A photovoltaic cell array involving rows and columns of tandem or stacked solar cell units composed of GaSa/GaSb associated with a radiation collector have produced measured energy conversion efficiencies of 31% AMO. The booster GaSb cell is manufactured by a process which produces a p-type diffusion region within an n-type substrate, has improved energy conversion efficiencies and can be mounted as part of a four terminal stacked solar cell unit.

49 Claims, 5 Drawing Sheets

TANDEM PHOTOVOLTAIC SOLAR CELL WITH III-V DIFFUSED JUNCTION BOOSTER CELL

This application is a continuation-in-part of application Ser. No. 07/339,311 filed Apr. 17, 1989, now abandoned.

This invention relates to mechanically stacked, tandem photovoltaic solar cells which converts incident sunlight to electric power preferably with high energy conversion efficiencies, and more particularly to a novel III-V diffused booster cell, its method of fabrication and the tandem interconnection with an improved transparent upper photovoltaic cell.

BACKGROUND

Several different types and methods of producing solar cells are known in the industry. An ongoing objective of solar cell manufacturers is to improve the conversion efficiencies of the solar cells in a cost effective manner.

More recently, higher energy conversion efficiencies have been obtained with mechanically stacked multijunction solar cells. This mechanical stacking generally consists of stacking a top cell that absorbs higher frequency light (i.e. a high bandgap cell) on a booster cell which will absorb the lower frequency light that passes through the top cell (i.e. a low bandgap cell). See Fraas, "Current Topics in Phtovoltaics", p. 169, Academic Press (1985) Partain et al., "26.1% Solar Cell Efficiency For Ge Mechanically Stacked Under GaAs", 62 *J. Appl. Phys.*, p. 3010 (1987). One example of a lower band gap booster cell is germanium (Ge). See Partain, supra, Another example of a lower band gap booster is gallium antimonide (GaSb). See Fraas et al, "GaSb Film Grown by Vacuum Chemical Epitaxy Using Triethyl Antimony And Triethyl Gallium Source", 61 *J. Appl. Phys.*, p. 2861 (1987). Theoretical projections of the performance of a GaAs on GaSb mechanical stack have been reported; see Fraas et al, "Near-Term Higher Efficiencies With Mechanically Stacked Two-Color Solar Batteries", 19 *Solar Cells* p. 73 (1986-87), but no high performance booster cells have previously been fabricated. Copper Indium Diselenide is another booster cell for GaAs. See U.S. Pat. Nos. 4,680,422 and 4,795,501.

In Mc Leod et al U.S. Pat. No. 4,776,893 it was presumed that a passivation window of aluminum gallium antimonide (AlGaSb) would be required for the bottom cell. Forming such a passivation window would necessitate the use of a costly, low throughput epitaxial processing to produce the GaSb cells.

GaSb photodiodes fabricated by zinc diffusion from a zinc-silica spin on film is described by W. Schmidt auf. Altenstadt and C. Heinz in *Physica* 129B, p. 497, 1985. The zinc concentration obtained by that process were too low for solar cells.

SUMMARY OF THE INVENTION

Accordingly, the present invention preferably provides a novel solar cell that overcomes the above deficiencies. When located at the focus of a sunlight concentrating lens, the best of the prior art GaAs satellite solar cells, where air mass effects are 0, i.e. AM0, convert about 22% (AM0) of the incident sunlight to electric power. By the invention disclosed herein, this conversion efficiency has been increased to about 31% (AM0, 100 suns D) which is a new world record conversion efficiency for a satellite photovoltaic device.

The improved results come from a number of refinements constituting light conditioning means which include modifying the upper or front GaAs cell of the tandem unit to be transparent to energy having a longer wavelength than the wavelength to which GaAs is responsive, use of multiple layers of anti-reflective coatings, placing a novel infrared sensitive GaSb booster cell that has a band gap of about 0.72 eV behind the GaAs cell, and attaching a prism or prismatic coverglass that is aligned with cell grid lines of each cell or at least the GaAs cell, to deflect incident light rays into active cell area.

The invention also provides a method for improving the energy conversion efficiency of a GaAs/GaSb tandem solar cell by using a diffused junction GaSb cell which does not have an upper, passivating, epitaxial overcoat in a tandem concentrator configuration.

Still other features of the present invention are to provide a novel cell production method that is scaleable for efficient large volume production for GaSb cells, certain aspects of which are applicable to other III-V solar cells, and to provide cells produced by that method.

Yet another feature of the invention is to provide a photovoltaic GaSb cell which does not require a passivation layer, but instead uses a p-dopant such as zinc, the thickness of the layer being reduced in active areas between grid lines to nearly double the short circuit current.

It is another major object of the invention to provide a novel solar cell array composed of a solar collecting lens and multiple wafer type cells that are mechanically stacked with the upper cell being transparent to pass infrared energy to the lower cell. The mounting of the tandem cells and the current collecting and voltage matching arrangements provide a two-terminal device which may be used also in terrestrial applications where a world record conversion efficiency of about 34-37% has been measured AM 1.5D (100suns).

The preferred embodiment of the present invention utilizes a III-V compound semiconductor material, such as gallium antimonide (GaSb), as a substrate for the booster cell. Into a windowed portion of the n-type substrate surface a p-type doping material, such as zinc, is diffused. A passivating layer for GaSb, previously through to be essential, is not used. A grid in the form of parallel lines of conductive material that are in direct contact with the p-type material in the diffused region of the semiconductor is connected to the front side metallization bus which is on an insulative mask of a suitable material such as silicon nitride. A metal contact is also formed on the back side of the substrate. Prior to coating with an anti-reflective material, the diffused area is etched back to reduce the emitter depth so that the short circuit current will be increased.

According to a preferred method of fabricating the GaSb cell, the n-type semiconductor material receives a patterned layer of insulative material containing an opening through which a p-type dopant is diffused. A grid of conductive material is thereafter formed on the diffused area and a bus is placed on the layer of insulative material to contact said grid, but not the semiconductor material. A metallized surface is formed on the opposite side of the semiconductor material. Non-metallized areas of the diffused portions are etched to increase the short circuit current and anti-reflective layers are applied to said etched areas to further increase the short circuit current.

These and other features of the invention will become more fully apparent from the claims and from the description as it proceeds in connection with the appended drawings.

DESCRIPTION OF PREFERRED EMBODIMENTS

Figure 1:
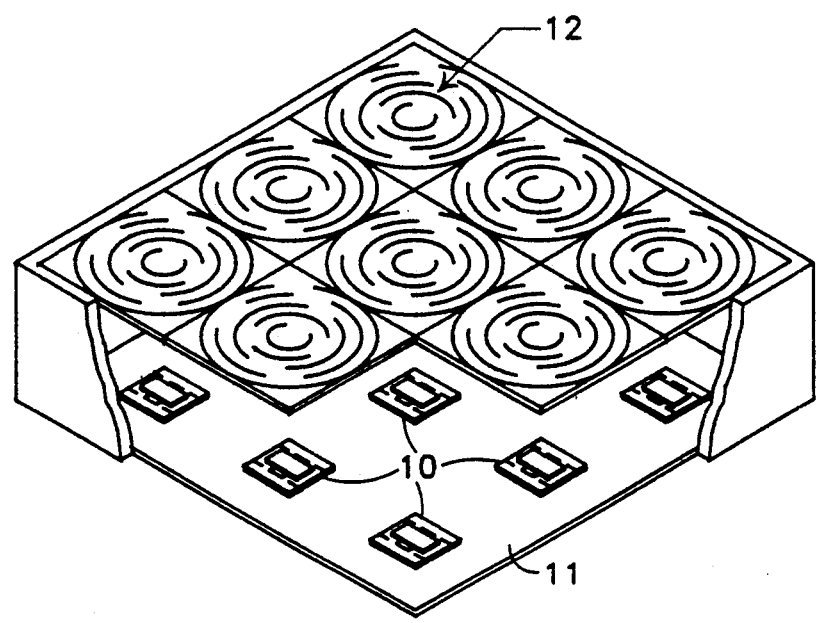
FIG. 1 is a pictorial view of a multi-cell solar energy array embodying a preferred embodiment of the present invention.

Referring to FIG. 1, the sunlight concentrating photovoltaic array of the present invention is illustrated by an arrangement of nine solar cell units 10 in a housing 11 which includes also a concentrating lens 12 which has nine focal regions, one for each cell. Each of the solar cell units 10 is substantially equidistant from its respective concentrating lens 12.

Figure 2:
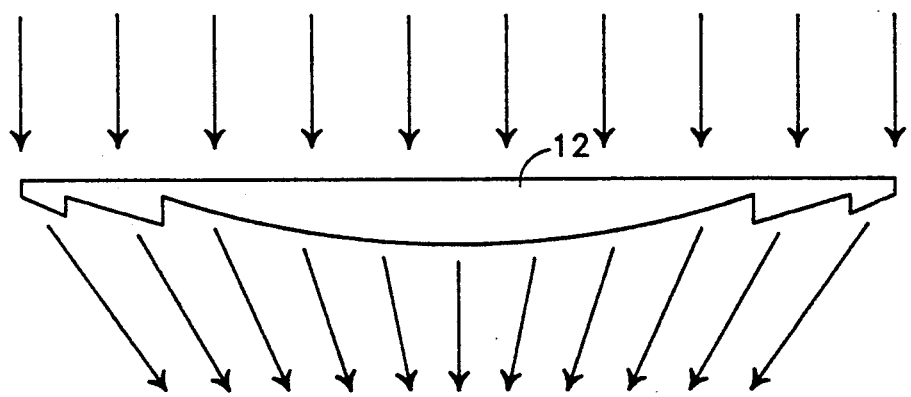
FIG. 2 is a diagrammatic view of a single cell of the array of FIG. 1.
Figure 2:
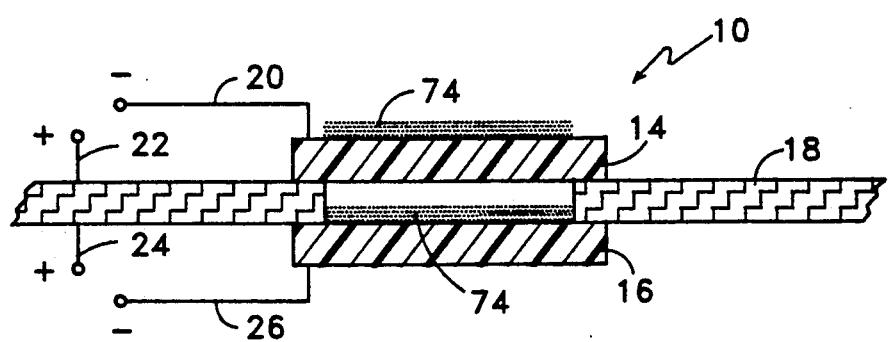

Each solar cell unit 10 may be of a type illustrated in FIG. 2, and positioned in optical alignment with its portion of the concentrating lens. The cell unit 10 is shown to be formed of two cells, one being an upper cell 14 and the other being a lower cell 16. The cells 14, 16 are mechanically separate so that during manufacture, an upper cell 14 may be selected for use with one of a group of lower cells 16. The cells 14,16 may have an active surface area of 0.049 cm$^2$, although it should be understood that areas of other sizes are also useful. The upper cell 14 is ideally transparent to the radiation to which the lower cell has sensitivity.

The cells 14, 16 may be separated by a space which allows separate electrical terminals to be provided for the lower surface of the upper cell 14 and the upper surface of the lower cell 16. The cells 14,16 may be mounted over holes in a ceramic-double sided printed wiring card 18 which is supported at an index position on the housing 11 thereby to serve as part of the array structure. The upper cells 14 are mounted on the front side of card 18 and the lower cells 16 of the tandem arrangement are mounted on the back side of the same card 18 to be an optical alignment with its associated upper cell. Other mounting arrangements for the cells may be used.

As illustrated in FIG. 2, the upper cell may have two terminals 20, 22 and the lower cell may have two terminals 24, 26. The terminal 22 may be connected with printed circuit wiring on the front side of card 18 while the terminal 24 is connected with an electrically separate printed circuit wiring on the back side of card 18. Card 18 may be a sapphire layer that serves also as a heat sink or spreader. $Al_2O_3$ and AlN materials are suitable as a support between the upper and lower cells, because they have electrical insulating and thermal conducting properties.

Figure 3:
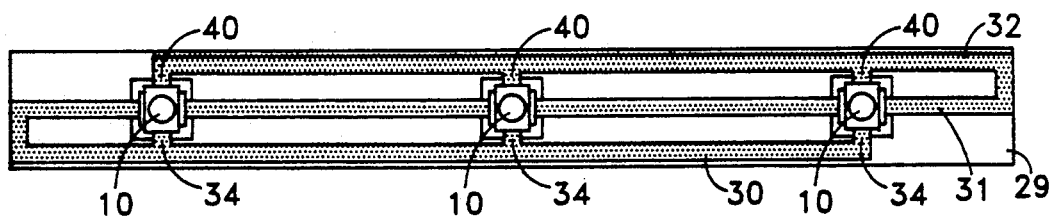
FIG. 3 is a view of a circuit ribbon that may be used for connecting the four terminals of a tandem cell unit to provide a two-terminal device.

An alternative interconnect between adjacent cells for terrestrial installations may be provided by a flex circuit ribbon 29 as shown in FIG. 3 which comprises electrical conductors on a suitable synthetic resin material. Three elongated flexible strips 30,31,32 of conductive material extend along the length of ribbon 29. The strip 30 is formed with a flap 34 that may engage the metallized surface that is on the upper surface of upper cell 14. The strip 32 is formed with a flap 40 that serves as an electrical connection to the lower surface of the upper cell 14. The strip 31 is connected electrically to the upper and lower surfaces of the lower cell 16 so that all three lower cells 16 are connected electrically in series. The upper cells are connected electrically in parallel. Where the upper cell open circuit voltage is approximately three times the open circuit voltage of the lower cell, this series and parallel connection system allows the cells to be connected together to give a two terminal device. It may be noted from FIGS. 10 and 11 that a GaAs cell has a maximum power voltage of 971 mV which is slightly less than the maximum power voltage for three series connected GaSb cells where each has a corresponding voltage of 380 mV.

GaAs Cell

Conventional GaAs cells must be made transparent to achieve the highest conversion efficiency in a tandem or stacked cell application. Several methods of forming GaAs photovoltaic cells are known in the art as explained in the Mc Leod et al U.S. Pat. No. 4,776,893. Further recent developments are reported in an article "Tertiary Butyl Arsine Grown GaAs Solar Cell" by Sundaram et al, *Appl. Phys. Lett.* 54 (7), Feb. 13, 1989, where growing p- and n-doped GaAs layers and p-AlGaAs layers for use as a concentrator solar cell structure is described. See also Fan et al, U.S. Pat. No. 4,547,622.

Three modifications to such GaAs cells are made when used with GaSb lower cells to optimize the conversion efficiency. First, the conventional continuous back metallization should be replaced with a gridded metallization. The back grid should use fewer grid liens than the front grid because the thicker wafer conductivity is much higher than the thinner emitter conductivity. The shading from the back grid may be omitted entirely.

Second, the water n-dopant density of the GaAs material should be reduced from $1 \times 10^{18}$ cm$^{-3}$ to about $1 \times 10^{17}$ cm$^{-3}$ to reduce free electron absorption.

Third, the anti-reflective (AR) coatings on the front and back of the GaAs cell are modified in order to provide minimal reflection across a broader bandwidth to assure passage of longer wavelength energy to which the GaSb cells are responsive.

Figure 5:
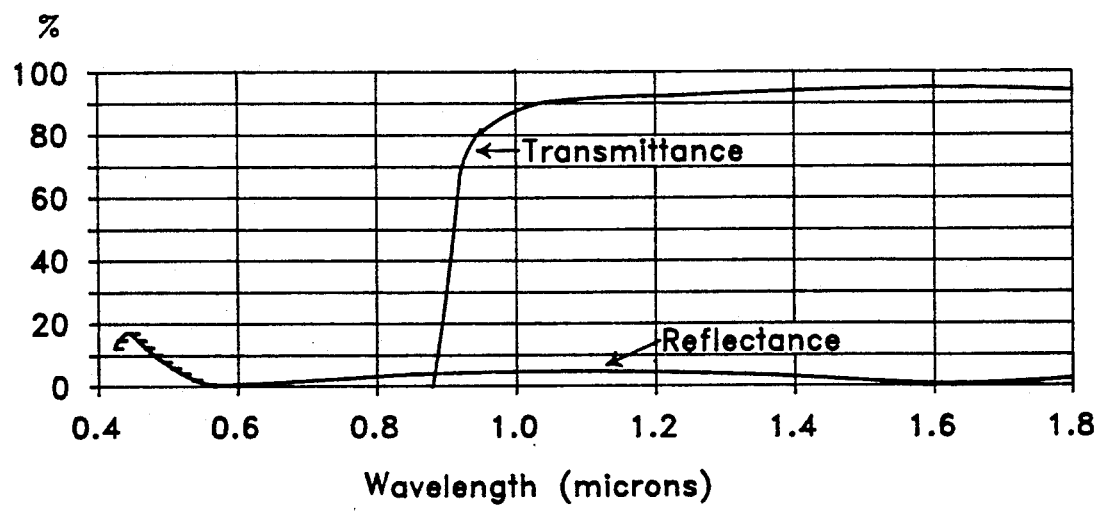
FIG. 5 is a curve showing the optical transparency properties of a gallium arsenide photovoltaic cell as shown in FIG. 4.

The presently preferred transparent GaAs cell design incorporates a 450 micrometer (micron) thick n-type wafer doped to about $1 \times 10^{17}$ cm$^{-3}$ with complete photovoltaic epitaxial structure grown on it including an AlGaAs window layer. A three layer AR coating on the front surface in addition to the AlGaAs window layer serves as the front side AR coating and a two layer AR coating has been applied to the back side in some embodiments. Important design parameters include the thickness and refractive index of each layer including the AlGaAs which functions not only as an electronic heteroface but also as one of the front AR layers. This multi-layer optical system produces a very broadband reflectance minimization through the visible energy range on out beyond the GaSb band edge at 1700 nm as illustrated in FIG. 5.

The GaAs cells and the GaSb cells may be of the same size. The chip size may be 3 mm×5 mm and the cell active area diameter may be 2.5 mm. Nineteen grid lines traverse the front active area of each such cell. The grid density is similar to that used with a GaAs cell designed for 20× sunlight concentration. For an n-type GaAs wafer doping density of $1 \times 10^{17}$ cm$^{-3}$ and for a 20× sunlight concentration, it appears that no grid lines are required on the back side of the GaAs cell.

Figure 4:
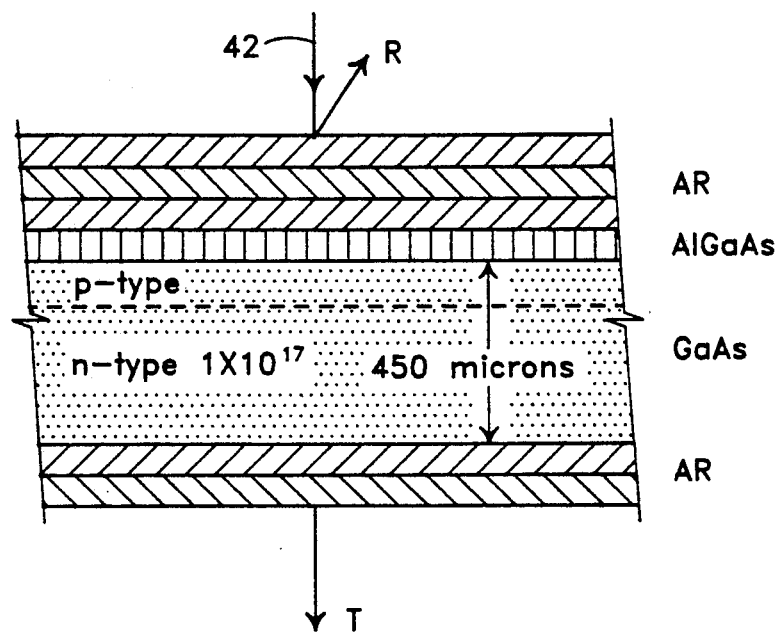
FIG. 4 is an elevation in cross section of the upper cell of a tandem cell unit.

FIG. 4 shows a cross section of one preferred GaAs solar cell that is adapted for use as part of the present invention. The solar energy along line 42 is directed toward the GaAs cell with a part being reflected along line R and a part being transmitted along line T. With anti-reflective coating layers AR on both the front and back sides of the GaAs cell, the relative transmittance and reflectance can be made to have values indicated by FIG. 5.

The upper AR layer includes the AlGaAs layer which may specifically be Al$_{0.5}$Ga$_{0.5}$As and about 0.05 microns thick to reflect free electrons toward the p-n junction in this cell. Three additional layers have been found effective to enhance the anti-reflective properties. Materials such as Ta$_2$O$_5$, MgO, MgF, Tio$_x$ and SiO$_2$ are materials that have been found effective. The thickness of each layer is but a fraction of the wavelength of the visible portion of the spectrum.

For optimum anti-reflective properties, the AR layer on the back side may require two equally thin layers of TiO$_x$ and SiO$_2$. Deposition by electron beam evaporation at room temperature may be used for applying these layers.

The electrical conducting grid pattern on the upper surface of the cell of FIG. 4 may consist of the usual parallel conductors applied by conventional photolithographic techniques. Pt/Au and Au/Ge/Ni/Au layers that are electron beam evaporated and appropriately heat treated to make p and n ohmic contacts on the front and back sides, respectively, may be used.

Because electrical conductivity of the n-type GaAs material is good, the back electrode may be made with fewer conductors and larger spacings between conductors. To provide maximum transparency properties to the upper GaAs cell, the electrical conductors on the base surface may be omitted in cases where cell areas are small.

GaSb Cell

Figure 6:
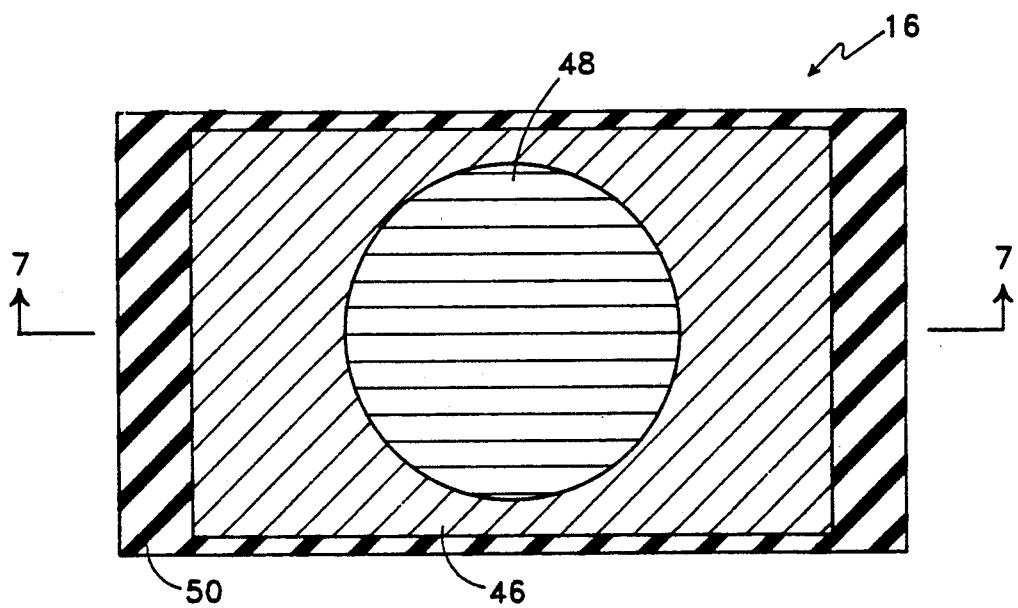
FIG. 6 is a top view of the lower cell of a tandem cell unit.
Figure 7:
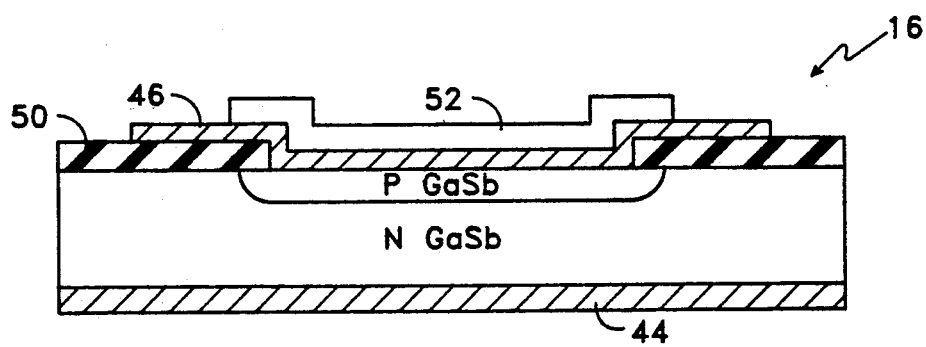
FIG. 7 is a elevation in cross section of the lower cell taken along lines 7—7 of FIG. 6.

FIGS. 6 and 7 diagrammatically illustrate the lower cell which is preferably made of GaSb. In the prior art Mc Leod U.S. Pat. No. 4,776,893, the GaSb solar cell included the use of an AlGaSb window layer. Fabrication was by a liquid-phase epitaxy method. The photovoltaic GaSb cell used in the tandem cell of the present invention does not employ the AlGaSb window layer in a preferred form, but instead advantageously may use an n-type GaSb wafer with a p-dopant, such as zinc, that is added by a less costly diffusion process.

The cell shown in FIG. 7, has a metallized base 44 which may be connected to the terminal 26 of FIG. 2.

The bus conductor layer 46 is an upper metallized surface which may be connected to the terminal 24 of FIG. 2. Two important aspects are that only the grid lines 48 are in contact with the semiconductor at the zinc diffused region designated P GaSb in FIG. 8 and the bus conductor layer 46 must be isolated from the GaSb semiconductor substrate. Because the process is essentially planar, the front side metallization is on an insulation mask 50 of an insulative material such as silicon nitride. The anti-reflective coating 52 is important in achieving efficient energy conversion but is not essential to operability of the solar cell.

The process for fabrication of the GaSb booster cell is generally applicable to III-V diffused junction photovoltaic cells. The reference to the specific gallium antimonide material is therefore to be construed as illustrative and not limiting. The process will be described with reference to FIGS. 8A-8E.

Preferably, substrate 61 is composed of a III-V compound semiconductor material single crystal. The use of an n-type substrate with a room temperature carrier concentration of approximately $10^{17}$ atoms/cm$^3$ is preferred and results in good device performance without a surface passivation layer. At lower doping levels, the surface of the n-type GaSb converts to p-type to an extent that degrades device performance. At higher doping levels, excessive tunneling through a junction degrades device performance. In one embodiment, the GaSb wafer may be doped with Te to $4 \times 10^{17}$/cm$^3$. Zinc is a preferred p-type dopant material.

An insulating layer 62 is then formed as a coating on the upper surface of substrate 61. Insulative layer 62 is preferably a two-layer coating of silicon nitride/silicon oxynitride. This two-layer system has been used in fabricating gallium arsenide lasers, and has been discovered here to be also effective for use in the method of the present invention. The first layer comprising silicon nitride is utilized to minimize any oxygen contact with substrate 61. The second layer comprising silicon oxynitride is much more stable and holds up to the high temperature excursion of a subsequent diffusion step. The two-layer insulating layer may be deposited using plasma chemical vapor deposition. The first layer of silicon nitride may be about 0.01 microns thick and the second layer of silicon oxynitride approximately 0.1 microns to perform effectively. Insulating layer 62 may also be applied by sputtering.

Insulating layer 62 is next treated to form opening 63 exposing a portion of substrate 61 as by using standard photolithography techniques. Thus, a layer of photoresist may be deposited in a patterned form on the insulating layer 62. Thereafter the photoresist is developed to remove the insulating layer 62 at the opening 63. A p-type dopant material, such as zinc, is then diffused into the exposed surface of substrate 61 to serve as a conductivity type modifier and form a p/n junction and p-type emitter 64.

Figure 8A:
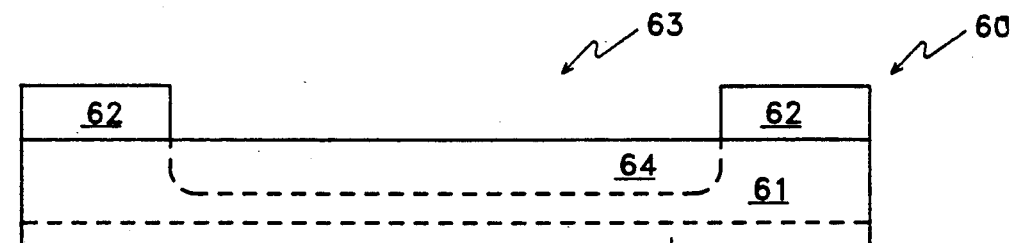
FIG. 8A–8E are process flow diagrams outlining the novel process for fabricating a III–V booster solar cell in accord with one feature of the present invention.

The diffusion step may be accomplished using a quasi-closed graphite box, not shown, in a conventional manner. The box has an elemental zinc source and an elemental antimony source. The elemental Sb source is provided to build up the antimony pressure in the diffusion chamber to prevent portions of the antimony in substrate 61 from exiting substrate 61. The elemental Zn provides a source of p-type dopant atoms which diffuse through opening 63 into the lattice substrate 61. The concentration versus depth into substrate 61 of the Zn dopant atoms is a function of time and temperature. The diffusion step preferably creates an emitter doped in the mid-$10^{20}$/cm$^3$ range to a depth of approximately 0.5 micrometers (microns). During the diffusion process, an unwanted zinc diffused region 65 forms on the back side of the substrate 61 as illustrated in FIG. 8A.

Figure 8B:
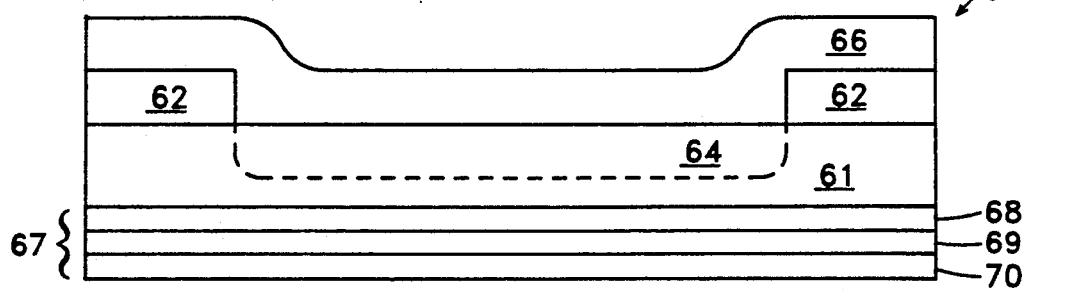

Following the diffusion step, a protective photoresist layer 66 is deposited on the surface of substrate 61 to form a patterned insulating layer 62 as shown in FIG. 8B. The back side or lower surface of substrate 61 is thereafter non-selectively etched to remove unwanted zinc that has diffused into region 65. Protective photoresist layer 66 is removed and a back side metallization contact layer 67 is formed.

Metallization contact layer 67 must have low electrical resistance, be adherent to the lower surface of substrate 61 and meet the qualifications for use in space or terrestial applications. A typical example may comprise three layers of metal: a layer of titanium (Ti) 68, a layer of palladium (Pd) 69, and a layer of gold (Au) 70. Platinum (Pt) would also be an acceptable alternative to palladium 69. Gold 70 is used because of its good electrical properties. Palladium 69 is used as a gold diffusion barrier to make contact between titanium 68 and gold 20 and to prevent gold 20 from diffusing into titanium 68 or substrate 61, FIG. 8B. The back side metal layers may be alloyed in a furnace.

Figure 8C:
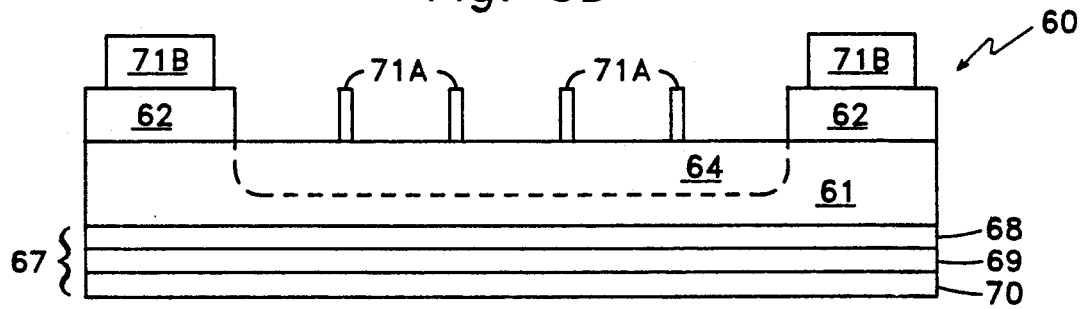

A second photolithographic step is used to form the grid pattern for a top metal 71. Top metal 71 consists of a grid portion of parallel lines 71A of conductive material and a bus portion 71B of conductive material as illustrated in FIG. 8C. Top metal 71 may comprise a layer of Pt and a layer of Au. Top metal 71 including grid lines 71A and bus portion 71B is formed using standard metal liftoff techniques. In actual processing, the thickness of metal layer 71 may be approximately 0.3 microns. Only the grid lines touch the junction region. The bus pad is deposited only on the patterned insulative material and is isolated from the n-type semiconductor substrate.

Figure 8D:
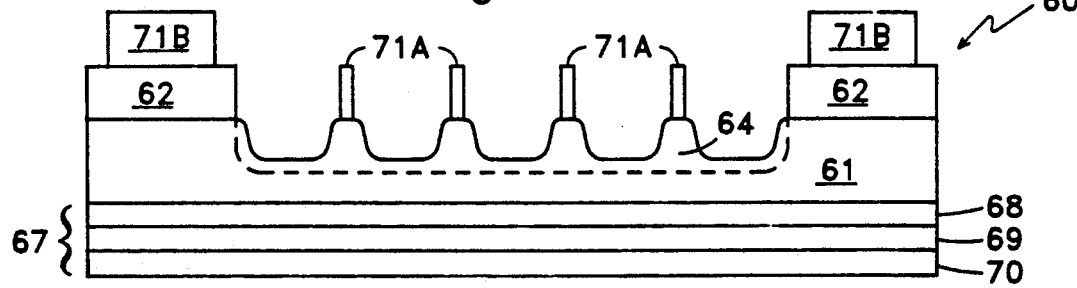

A front side etch is then performed to reduce the emitter thickness. This is illustrated in FIG. 8D but the drawing is not to scale. It should be noted that while the front side etch is not necessary, it has been found that with removal of emitter material to provide a recess between grid lines 71A beneficial results are obtained. For example, if the depth of the recess is sufficient so that the emitter material thickness is reduced from about 0.5 micrometers to about 0.1 micrometers, the device short circuit current rises by a factor of about 2. It is apparent that the depth of the zinc diffusion is variable with the depth under the conductive strips 71A being greater than the depth between the strips.

Figure 8E:
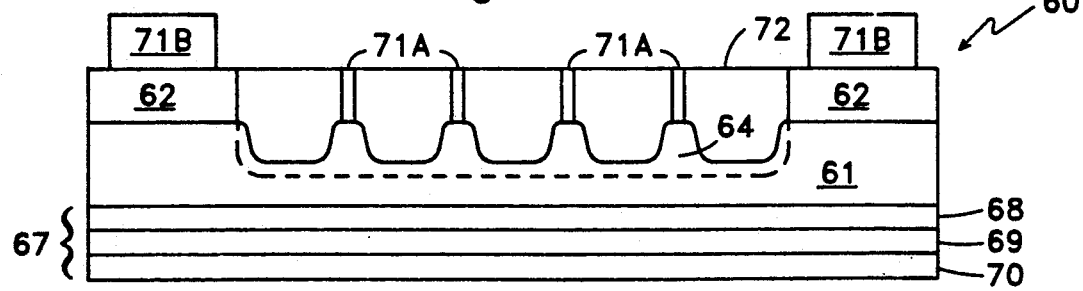

An anti-reflective coating 72 may be deposited as a coating over the emitter between the grid lines 71A as illustrated in FIG. 8E. FIG. 8E, like FIG. 8D, is diagrammatic and not to scale. Anti-reflective coating 22 may comprise a single layer or double layers and is often deposited using a vacuum deposition process as discussed in conjunction with the upper GaAs layer fabrication. It should be apparent to those skilled in the art that anti-reflective coating 22 should be tailored specifcally for a spectral region of interest for booster cell. One preferred embodiment of anti-reflective coating 22 is tantalum pentoxide ($Ta_2O_5$) having a thickness of approximately 0.15 microns which was found to raise the short circuit current by another 1.5 times.

Figure 9:
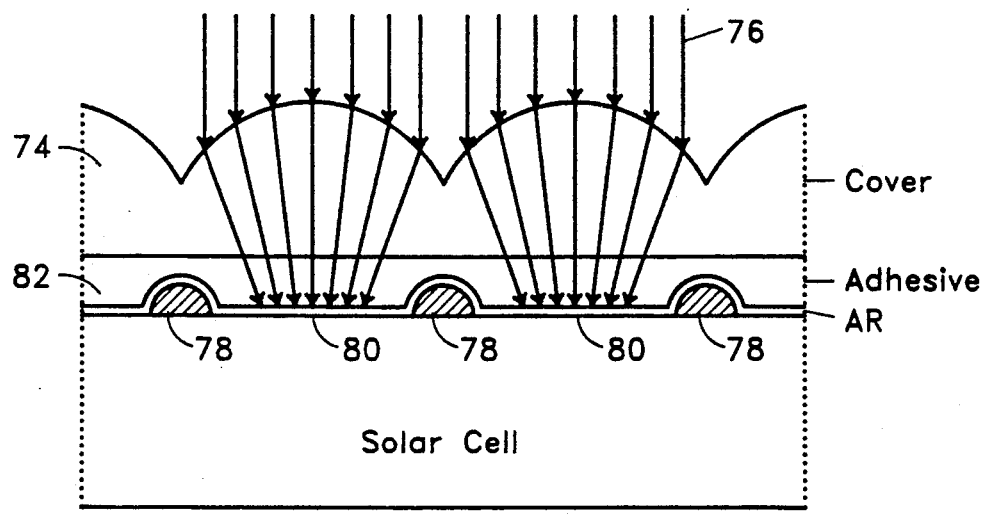
FIG. 9 is an elevation to a large scale showing a prismatic lens which optically eliminates grid line obscuration losses for the solar cells.

A prismatic cover-glass 74 which optically eliminates grid line obscuration losses for concentrator cells is shown in FIG. 2, and on an enlarged scale in FIG. 9. Incoming light rays 76 that otherwise might hit parallel grid lines 78 are simply bent slightly toward active cell areas 80 as they enter the thin molded cover 74 which may have the form of a cylindrical lens and be made of a synthetic resin material.

FIG. 9 shows the cover-glass 74 as it is applied by an adhesive 82 to both the GaAs and GaSb cells to boost the light generated currents and efficiencies of both cells 14,16. The observed gain in the GaAs cell current is near 10%. Since the GaSb cell in the FIG. 2 configuration is shaded by both the GaSb grid lines and the GaAs cell grid lines, the current increase for the GaSb cell is more than 10%. For assembled GaAs/GaSb tandem stacks the two cells are preferably mounted with their respective grid lines perpendicular to each other. The two sets of cylindrical lenses in the two prismatic covers are cross linear and such an arrangement contributes to the high energy conversion levels that have been obtained.

Figure 10:
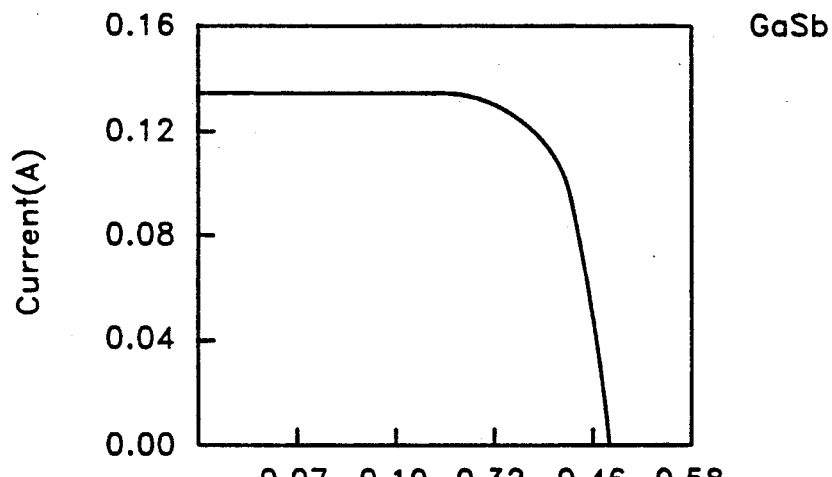
FIG. 10 is a curve showing current vs. voltage for an illuminated GaSb cell.

FIG. 10 shows performance data for an individual GaSb cell with a cover 74 as described in connection with FIG. 9 and broadband anti-reflective coatings as described and tested behind a GaAs radiation filter. The cell has an illuminated current versus voltage as illustrated and fill factor of 71.3%. The open circuit voltage is 480 mV. The illuminated short circuit current density is 2702 mA/cm$^2$. Boost efficiencies are 8.2% for space application where air mass effects are 0 (AMO) and 9.3% where air mass density is 1.5 directed (AM 1.5 D). Concentrated light intensities of near 100 suns equivalent were used.

Figure 11:
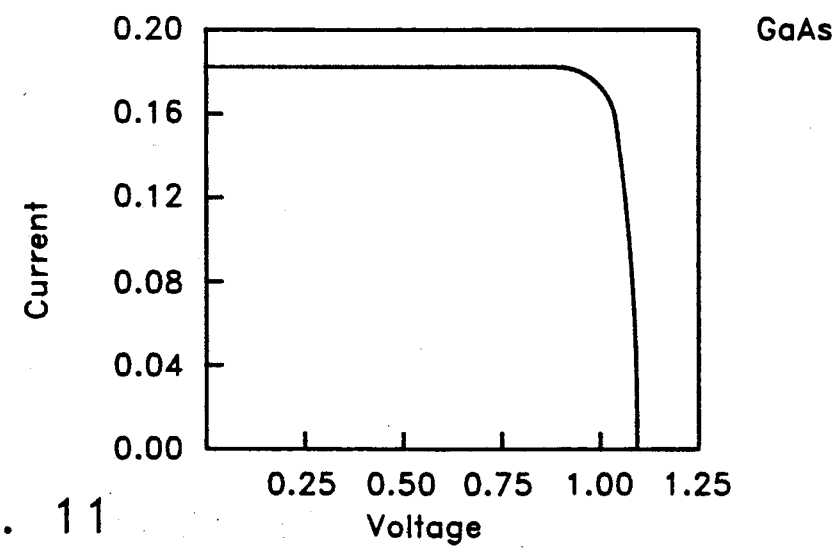
FIG. 11 is a curve showing current vs. voltage for an illuminated GaAs cell.

FIG. 11 shows similar data for an individual GaAs cell with a prismatic cover 74 as described in connection with FIG. 10 and anti-reflective coatings as described above. The curve shows illuminated current versus voltage. The open circuit voltage is 1100 mV and the fill factor is 0.85. The illuminated short circuit current density is 3472 mA/cm$^2$. Energy conversion efficiencies are 24.1% (AMO) and 28.9% (AM 1.5 D) at a light concentration near 100 suns equivalent.

Theoretical tandem cell stack efficiencies sum to 9.3% + 28.9% = 38.2 at AM 1.5 D. This conversion efficiency translates to 8.2% + 24.1% = 32.3% for space (AMO). Several tandem cell stacks actually have been fabricated with AMO energy conversion efficiencies of at least 31% and with AM 1.5 D energy conversion efficiencies of between 34% and 37%. The higher efficiencies are achieved with the best cells used.

While preferred embodiments have been shown and described, those skilled in the art will readily recognize alterations, variations, or modifications that might be made to the particular embodiments that have described without departing from the inventive concept. This description and the drawings are intended to illustrate the invention (and its preferred embodiments), and are not meant to limit the invention.

We claim:

1. A method for improving the energy conversion efficiency of a GaAs/GaSb tandem solar cell, comprising the step of using a diffused junction GaSb cell.

2. A GaAs/GaSb tandem solar cell having improved conversion efficiency, comprising:

(a) a GaAs upper cell having a predetermined bandgap selected for optimal performance of the tandem solar cell;

(b) a GaSb booster cell positioned beneath the GaAs upper cell to receive light transmitted through the GaAs upper cell and responsive to such light; and (c) light conditioning means associated with the upper cell and the booster cell for achieving an energy conversion efficiency of at least 31% AM0.

3. The cell as defined in claim 2, wherein the light conditioning means includes a prismatic coverglass for optically eliminating grid line obscuration losses on at least said upper cell and a concentrating lens for focusing solar energy onto an upper surface of said upper cell.

4. The cell as defined in claim 3, further having multiple layers of anti-reflective materials on each of opposite surfaces of said upper cell.

5. A tandem solar cell unit for efficient conversion of solar energy into electrical energy comprising:
an upper solar cell that is transparent to radiation energy at a wavelength longer than the wavelength to which said upper cell is sensitive, said upper cell having parallel grid lines of conductive material on an upper surface thereof;
a lower solar cell sensitive to said longer wavelength energy mounted in optical alignment with said upper cell to receive said longer wavelength energy, said lower cell having parallel grid lines of conductive material on an upper surface thereof;
multiple anti-reflective layers of different materials on an upper surface of said upper cell;
multiple anti-reflective layers of different materials positioned between the upper and lower cells; and
means for optically eliminating grid line obscuration losses on at least said upper cell.

6. The solar cell unit as defined in claim 5, wherein the lower cell is made of GaSb semiconductor material with n-type conductivity having said upper surface coated with an insulating layer which has an aperture that serves as a mask opening for diffusion of a p-type emitter dopant into said semiconductor under the aperture but not under the insulating layer; and
said upper surface has a bus conductor overlying said insulative layer and electrically connected to said grid lines which extend across a p-type doped layer surface so that the bus conductor is electrically isolated from said semiconductor.

7. The solar cell unit as defined in claim 6, wherein the diffused p-type doped layer has a depth of approximately 0.5 micrometer, the grid lines are deposited on a surface of said p-type doped layer and the emitter depth between the grid lines is sufficiently small to cause the short circuit current to rise.

8. The solar cell unit as defined in claim 7, wherein the doped layer between the grid lines contains an antireflective coating that is effective to further increase the short circuit current.

9. The solar cell unit as defined in claim 8, wherein the anti-reflective layer on the doped layer includes tantalum pentoxide.

10. The solar cell unit as defined in claim 5, wherein the upper cell is made of GaAs with an n-type dopant density to reduce free electron absorption, said upper cell having fewer grid lines on its lower surface than on the upper surface.

11. The solar cell unit as defined in claim 5, further comprising a solar concentrating means.

12. A solar cell array comprising:
a solar energy collector;
a plurality of solar cell units positioned with respect to one another and with respect to a solar energy collector;
a first group of cells made of GaAs and a second group of cells made of GaSb that are each mechanically stacked relative to and physically separate from a corresponding one of the GaAs cells of the first group;
said GaAs cells having on an upper surface nearest said collector a multiple layer of different materials to form an upper anti-reflective coating that passes solar energy having wavelengths longer than wavelengths of energy absorbed by GaAs in addition to one layer that also serves to reflect free electrons toward a p-n junction in said GaAs cell;
parallel conductors on the upper surface of the GaAs cells which are connected to a first cell terminal;
electrical contact means on the lower surface of the GaAs cells which are connected to a second cell terminal;
said GaSb cells having a p-type diffusion layer and a radiation receiving area, said radiation receiving area having parallel conductors on an upper surface contacting the diffusion layer in each GaSb cell, said parallel conductors being connected to a third cell terminal that is electrical isolated from said second cell terminal;
said GaSb cells having a metallized lower surface connected to a fourth cell terminal.

13. The array as defined in claim 12, wherein the GaAs cell of each cell pair is in optical alignment with the GaSb cell of the same cell pair and physically spaced so that the facing lower surface of the GaAs cell is electrically isolated from the facing upper surface of the GaSb cell.

14. The array as defined in claim 13, wherein said plurality of cell pairs are arranged in rows and columns to be substantially equidistant from said collector, there being layers of different materials to form a second lower anti-reflective coating located between the stacked cells.

15. The array as defined in claim 14, wherein the physical spacing between the facing surfaces of the GaAs and GaSb cells is provided by a printed circuit board which has conductors on opposite sides that are connected to said second and third terminals.

16. The array as defined in claim 14, having a prismatic cell cover-glass associated with the upper cell which reduces obscuration losses due to said parallel conductors on the upper GaAs surface.

17. The array as defined in claim 16, wherein a second prismatic cell cover-glass is associated with the GaSb cell, said prismatic cell cover-glass being shaped and oriented to reduce obscuration losses of the parallel conductors on the upper GaSb surface.

18. The array as defined in claim 12, wherein the electrical contact means on the lower surface of the GaAs cells is configured to provide maximum transparency to the wavelength spectrum to which the GaSb cell is responsive.

19. The array as defined in claim 24, further having on the lower surface of the GaAs cells layers of different materials to form a lower anti-reflective coating.

20. The array as defined in claim 12, further having on a lower surface of the GaAs cells that is remote from said solar energy collector layers of different materials to form a lower anti-reflective coating.

21. A tandem solar cell unit that is adapted for use with a solar energy collector and comprises:

an upper solar cell that is transparent to radiation energy at a wavelength longer than the wavelength to which said upper cell is sensitive and a lower solar cell comprising a diffused junction GaSb layer substrate, said cells being in optical alignment so that substantially all radiation energy that passes through the upper cell is received by the lower cell;

means to enhance anti-reflective properties for the wavelengths of energy to which both solar cells are responsive including a plurality of thin layers of different materials on an upper surface of said upper solar cell;

conductive material on an upper surface of each cell that is connected to respective first and second electrical terminals;

the lower surface of the upper cell having electrical current conductive properties and being connected to a third electrical terminal; and the lower surface of the lower cell having a metallized layer connected to a fourth electrical terminal.

22. The solar cell as defined in claim 21, wherein the conductive material on the upper surface of the upper cell is in the form of parallel conductors that are positioned to be between said upper cell upper surface and a prismatic cover-glass that is shaped to reduce obscuration losses due to said parallel conductors.

23. The solar cell as defined in claim 22, wherein the conductive material on the upper surface of the lower cell is in the form of parallel conductors that are between the p-type diffusion layer and a second prismatic cover-glass that is shaped to reduce obscuration losses due to the parallel conductors on said lower cell.

24. The solar cell as defined in claim 21, wherein the upper surface of the lower solar cell substrate contains a layer of electrical insulating material that has a central opening;

said p-type diffusion layer on the upper substrate surface is within said opening;

the conductive material on the upper surface of the lower solar cell substrate comprises a plurality of conductors on the diffusion layer and a bus portion that is on top of said insulating material layer, said bus portion providing an electrical current path between said parallel conductors on the diffusion layer and one of said terminals.

25. The solar cell as defined in claim 24, wherein an upper surface portion of said diffusion layer that is located between said parallel conductors contains depressions formed by removal of an amount of said diffusion layer that is sufficient to increase the short circuit current of the lower solar cell.

26. The solar cell as defined in claim 25, further comprising an anti-reflective coating material applied in said depressions between said parallel conductors that is effective to further increase the short circuit current of the lower solar cell.

27. The solar cell as defined in claim 26, wherein the anti-reflective, current enhancing means comprises at least two layers of different anti-reflective materials between the lower surface of said upper solar cell and the upper surface of the lower cell.

28. The solar cell as defined in claim 21, wherein the means to enhance anti-reflective properties further include layers on the lower surface of the upper solar cell.

29. An array of tandem solar cell units in a housing comprising:

rows and columns of discrete solar cell units including an upper cell having a first pair of terminals, a lower cell mounted in optical alignment with and beneath a corresponding upper cell, said lower cell having a second pair of terminals;

a support member of electrically insulating thermally conducting material anchored to said housing and contacting the lower side of the upper cell and the upper side of the lower cell said support member having an aperture optically aligned with the said upper and lower cells for transmission of solar energy between the upper cell to the lower cell;

electrical conductors carried by said support member which provide electrical current paths between the upper and lower surfaces of the upper and lower cells and said first and second pairs of terminals;

said lower cell being a III-V n-type semiconductor which has:

a layer of electrical insulating material that has a central opening on an upper surface of said lower cell;

a p-type dopant material diffused in the upper surface through said central opening to form a diffusion layer; and conductive material on the cell upper surface which comprises a plurality of parallel conductors that are on the diffusion layer and a bus portion that is on top of said insulating material, said bus portion providing an electrical current path between said parallel conductors on the diffusion layer and one of said electrical conductors carried by said support member;

a solar energy concentrating element associated with each solar cell unit; and a first anti-reflective material on the upper surface of an upper cell and a second anti-reflective material between the lower surface of the upper cell and the upper surface of the lower cell.

30. The solar cell array as defined in claim 29, wherein an upper surface portion of the diffusion layer that is located between said parallel conductors is removed to form surface depressions to increase short circuit current and an anti-reflective coating material is applied in said depressions between the parallel conductors.

31. The solar cell array in claim 30, further comprising a prismatic cover-glass which optically eliminates grid line obscuration losses having a lower surface that is adhered to the top surface of the lower solar cell.

32. The solar cell array as defined in claim 31, wherein the upper cell has an upper surface having conductive material in the form of parallel conductors that are positioned so as to be optically covered by a prismatic cover-glass, said cover-glass being shaped to reduce obscuration losses in said upper cell due to said parallel conductors.

33. A method for producing a solar cell comprising the steps of:

providing a GaSb substrate of n conductivity type;

depositing an insulating layer on a first surface of said substrate;

depositing a layer of photoresist on said insulating layer;

developing said photoresist to form an opening therethrough and to expose a portion of said insulating layer;

etching said exposed portion of said insulating layer to expose a portion of said substrate;

diffusing a p-type dopant into said exposed portion of said substrate to form a p-type diffused area;

depositing a protective material on said diffused area;

non-selectively etching a second surface of said substrate to remove any unwanted p-type dopant;

depositing a contact metal layer on said second surface of said substrate;

depositing a layer of photoresist on the first surface of said substrate;

exposing said photoresist to define a grid opening and a bus opening therethrough;

developing said photoresist to form openings therethrough which expose portions of said diffused and non-diffused areas of said substrate first surface;

depositing a metal on said photoresist and in said openings defined therethrough;

removing said photoresist and said metal deposited thereon; and etching non-metallized portions of said diffused area of said substrate by an amount sufficient to increase short circuit current of the cell.

34. The method of claim 33, wherein said p-type diffused area comprises zinc doped in a mid-$10^{20}$/cm$^3$ range to a depth of approximately 0.5 micrometers.

35. The method of claim 34, wherein the method further comprises etching non-metallized portions of said diffused area by a depth of about 0.4 micrometers to form recesses between the metallized portions, and depositing a layer of anti-reflective material in said recesses.

36. The method of claim 33 wherein the insulating layer comprises a thin silicon nitride layer in contact with said substrate and a thicker overlying silicon oxynitride layer.

37. A method for producing a solar cell, comprising the steps of:

providing a body of n-type GaSb material including on one surface a covered portion defined by a lower of insulating material over the GaSb and at least one uncovered portion;

diffusing a p-type dopant into the GaSb through said uncovered portion to form a p-n junction near said surface;

metallizing said surface by depositing a layer of conductive material on the GaSb on the uncovered portion to form grid lines and on the covered portion of insulating material to form a bus.

38. The method of claim 37 further including the step of attaching external electrical circuit connections to the bus.

39. The method of claim 37 wherein the step of metallizing comprises the steps of:

depositing a layer of photoresist on said insulating layer;

removing the photoresist to define the grid lines in the originally uncovered portion and the bus;

depositing metal over the photo-patterned cell; and removing the remaining photoresist and metal deposited on the photoresist while leaving the grid lines and bus.

40. The method of claim 37, wherein the steps of forming said grid and said bus are performed in a single operation.

41. The product of the method of claim 40.

42. The product formed by the method of claim 37.

43. In a tandem solar cell having a front solar cell through which radiation passes to a booster solar cell, said booster cell comprising:

an n-type GaSb material having a zinc diffused region being free of an AlGaSb window layer for surface passivation on a portion of a first surface of the GaSb, said first surface being mounted to receive radiation passing through said front solar cell and having a marginal edge covered with an insulating layer;

a back metal contact adhered to a second surface of the GaSb; and metallization on said first surface including a layer of conducting material extending over at least a portion of said insulating layer and patterned to provide grid lines formed to pass solar energy into said zinc diffused region and contacting said zinc diffused region for providing a low resistance electric current path to an edge surface of the metallization that is supported on said insulating layer and out of contact with the GaSb material.

44. The solar cell of claim 43 wherein said grid lines are in the form of parallel strips of conductive material and the thickness of the zinc diffused region is variable with the thickness under the strips being greater than the thickness between the strips.

45. The solar cell of claim 43 wherein said insulating layer comprises a first layer of silicon nitride and a second layer of silicon oxynitride.

46. The solar cell of claim 43 wherein the front solar cell is made of GaAs that is transparent to radiation to which the booster solar cell is responsive and formed with metallization that minimizes shadowing of the booster cell.

47. A method of converting solar energy to electrical energy by exposing a tandem solar cell to concentrated sunlight, said tandem cell being comprised of an upper GaAs solar cell facing said sunlight and a lower diffused junction GaSb solar cell.

48. The method of claim 47 wherein the GaSb cell is free of any upper, passivating, epitaxial overcoat.

49. A solar concentrator module comprising a tandem solar cell comprised of an upper GaAs solar cell and a lower diffused junction GaSb solar cell; and a solar concentrating means for focusing and concentrating incident light upon the tandem solar cell.

* * * * *